9/27/83 XR 4,406,967

United States Patent [19]

Obara et al.

[11] 4,406,967

[45] Sep. 27, 1983

[54] ULTRASONIC PROBE

[75] Inventors: Hiroshi Obara; Naohiro Murayama, both of Iwaki, Japan

[73] Assignee: Kureha Kagaku Kogyo Kabushiki Kaisha, Tokyo, Japan

[21] Appl. No.: 295,567

[22] Filed: Aug. 24, 1981

[30] Foreign Application Priority Data

Aug. 23, 1980 [JP] Japan ............................ 55-116162

[51] Int. Cl.$^3$ ...................... H04R 17/00; H01L 41/18

[52] U.S. Cl. ................................ 310/366; 310/800; 310/322

[58] Field of Search ............... 310/320, 322, 325, 326, 310/327, 365, 366, 800

[56] References Cited

U.S. PATENT DOCUMENTS

| | | | |
|---|---|---|---|
| 3,832,580 | 8/1974 | Yamamuro et al. | 310/800 X |
| 3,903,733 | 9/1975 | Murayama et al. | 310/800 X |
| 3,946,149 | 3/1976 | White | 310/327 |
| 4,038,615 | 7/1977 | Ishiyama et al. | 310/366 X |
| 4,137,475 | 1/1979 | Yoshida et al. | 310/800 X |

FOREIGN PATENT DOCUMENTS 55-151894 11/1980 Japan .

OTHER PUBLICATIONS

F. Mattiocco, "$PVF_2$ Transducers for Rayleigh Waves", Electronics Letters, Mar. 27, 1980, vol. 16, No. 7, pp. 250–251.

*Primary Examiner*—William M. Shoop
*Assistant Examiner*—Peter S. Wong
*Attorney, Agent, or Firm*—Woodcock, Washburn, Kurtz, Mackiewicz & Norris

[57] ABSTRACT

The ultrasonic probe of this invention contains a uniaxially elongated polymer piezoelectric element in which the piezoelectric element provided at the both sides with a thin layer electrode is disposed such that at least one of the electrodes is divided into long and small electrode portions to form a unit element and the unit elements are arranged in a direction at an angle in the scope ranging from 45° to 135° with respect to the direction in which the piezoelectric material is uniaxially elongated.

The ultrasonic probe having the aforesaid structure is constructed such that each of the unit elements undergoes no adverse influence from the adjacent unit elements so that it permits a high resolving power without any noise acoustic waves generated.

5 Claims, 4 Drawing Figures

ULTRASONIC PROBE

BACKGROUND OF THE INVENTION

1. Field of the Invention

The present invention relates to an ultrasonic probe using a piezoelectric polymer sheet, which is particularly effective for use with an ultrasonic diagnostic apparatus.

2. Brief Descpription of the Prior Art

Recently, diagnostic apparatus utilizing the ultrasonic pulse reflection method has come into wide use. This ultrasonic diagnosing apparatus uses a probe comprising a piezoelectric element. The scanning method of the probe is of mechanical type or of electronic type. A recent development on electronic scanning type ultrasonic diagnosing apparatus is remarkable.

It is known that an array prepared by dividing into a multiplicity of sub-divisions a piezoelectric ceramic element of lead titanate, lead titanozirconate or the like has heretofore been employed as a probe for use with apparatus of the electronic scanning type. This probe has a structure in which a number of piezoelectric unit elements 5*a*, 5*b*, 5*c*, . . . , 5*n* are bonded on a backing material 1 and disposed thereon with a predetermined distance separately or independently from each other, as shown in FIG. 1. Alternatively, as shown in FIG. 2, there is an alternative integrated probe embodiment in which only electrodes in the piezoelectric element are divided into small unit elements. Although this alternative integrated probe embodiment is simple enough to manufacture, the resulting ceramic element has a small attenuation of an ultrasonic wave in the element so that, for example, where an element portion corresponding to the electrode 3*b* is excited, the vibration may be propagated to the adjacent element portions, causing a crosstalk to occur. In usual instances where the piezoelectric element is electrically driven, the vibrations both in the thickness direction and in the transverse direction may occur. Accordingly, where the structure is of the integrated type as shown in FIG. 2, the adjacent elemment portions or unit elements are bound to each other by means of the vibration in the transverse direction so that the mode in the thickness vibration required is disturbed or distorted to a great extent. In order to prevent these drawbacks, it is necessary to separate each of the piezoelectric elements as shown in FIG. 1; however, such precision in processing and assembling is required that the cost of manufacture is excessive. Furthermore, as has already been described, an acoustic wave resulting from the lengthwise vibration is reflected against the side wall of the adjacent element, whereby noise acoustic waves are caused to occur.

Particular attention has now been drawn to piezoelectric polymer films represented by polyvinylidene fluoride for use as element of medical probes because their acoustic impedances are close to that of the living body.

The present invention has been completed as a result of extensive research and experiments carried out on the basis of a presumption that the separation of the elements as in FIG. 1 is not necessarily required in the case of piezoelectric polymer films by paying attention to the fact that the attenuation of ultrasonic waves in the piezoelectric polymer films is far larger than that of piezoelectric ceramic films and that piezoelectricity of polymer films varies in certain directions in the plane of the films with respect to others.

OBJECTS AND SUMMARY OF THE INVENTION

Therefore, an object of the present invention is to provide an ultrasonic probe in which the generation of noise acoustic waves accompanied with the transverse vibration is impeded.

Another object of the present invention is to provide an ultrasonic probe which may not cause any crosstalk.

A further object of the present invention is to provide an ultrasonic probe in which crosstalk is minimized and yet in which the thickness vibration mode is not disturbed.

A still further object of the present invention is to provide a ultrasonic probe having a high resolving power when used for an ultrasonic diagnostic apparatus.

A still further object of the present invention is to provide an ultrasonic probe which can be manufactured with a high processing precision and with ease.

In accordance with one aspect of the present invention, there is provided an ultrasonic probe containing a piezoelectric element comprising a backing material, a uniaxially elongated polymer piezoelectric material, the piezoelectric material interposed between a pair of electrodes, and at least one of the electrodes being divided into a plurality of long and small electrode portions and arranged in parallel with each other in which the electrodes are arranged at an angle in the scope ranging from 45° to 135° with respect to the direction in which the piezoelectric material is uniaxially elongated. Now, in the present invention, the direction in which the divided electrodes are disposed or the divisional direction described hereinafter is a direction orthogonal to the division lines.

The above and other objects, features and advantages of the present invention will be apparent from the following detailed description of illustrative embodiments which are to be read in connection with the accompanying drawings.

DETAILED DESCRIPTION OF THE PREFERRED EMBODIMENTS

The ultrasonic probe in accordance with the present invention employs an array formed by using a uniaxially elongated piezoelectric polymer so as to cause no crosstalk and reflecting waves. Piezoelectric materials of the ceramic type, such as PZT, which have been conventionally employed, on the one hand, have a piezoelectricity nearly homogeneous in each direction so that a vibrating wave produced at one point propagates uniformly in every direction along the plane thereof. The uniaxially elongated polymer films as employed in accordance with the present invention, on the other hand, have a piezoelectric constant $d_{31}$ in the elongational direction by from ten to several tens times the piezoelectric constant $d_{32}$ in the transverse direction. Its piezoelectric constant $d_{33}$ in the thickness direction is in the scope ranging from nearly a half of the constant $d_{31}$ to a value close thereto. Accordingly, where the length extensional vibration of each of the elements constituting the array is a vibrating wave based on the piezoelectric constant $d_{31}$, the vibrating wave has a strength similar to the thickness extensional vibrating wave based on the constant $d_{33}$ so that its influence is rendered extremely great, while the strength of the vibrating wave based on the constant $d_{32}$ is so small as compared to that of the thickness extensional vibrating wave. It is accordingly preferred that the length extensional vibration of each of the elements are arranged so as undergo no influence from the piezoelectric constant $d_{31}$ as much as possible, while it results mainly from the constant $d_{32}$. It is therefore most preferable that the divisional direction of a one-dimensional array is so arranged as to be orthogonal to the elongational direction of the uniaxially elongated polymer piezoelectric member. Where, however, the surface of a probe of the array arrangement is a curved surface, the divisional lines are not necesarily parallel to each other and the divisional directions cannot be defined in a uniform manner. In this case, it is necessary that the divisional directions are all intersected with the elongational direction at an angle $\theta$ ranging from 45° to 135°.

The present invention will be described more in detail with reference to the drawings.

Figure 1:
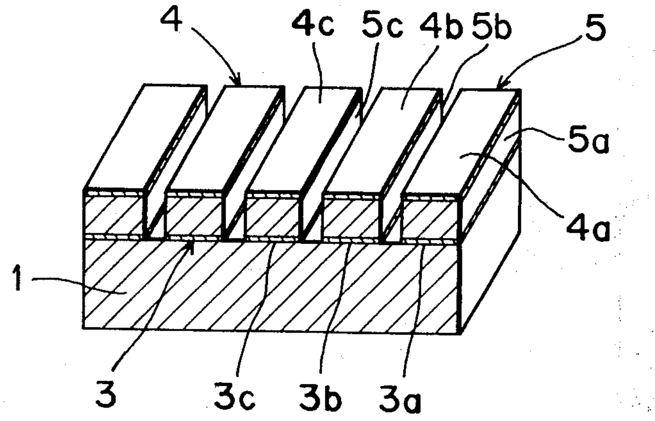
FIG.1 PRIOR ART
FIG. 1 is a perspective view illustrating the essential portion of a conventional ultrasonic probe.
Figure 2:
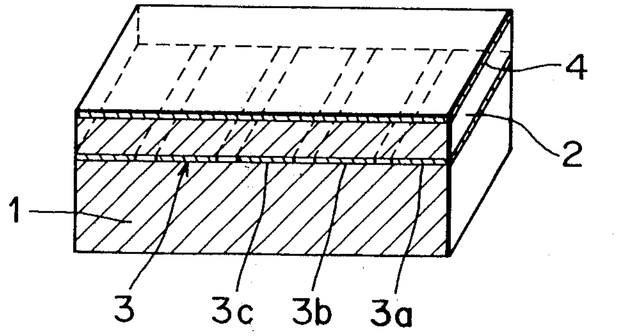
FIG.2 PRIOR ART
FIG. 2 is a perspective view illustrating the essential portion of another example of conventional ultrasonic probe.
Figure 3:
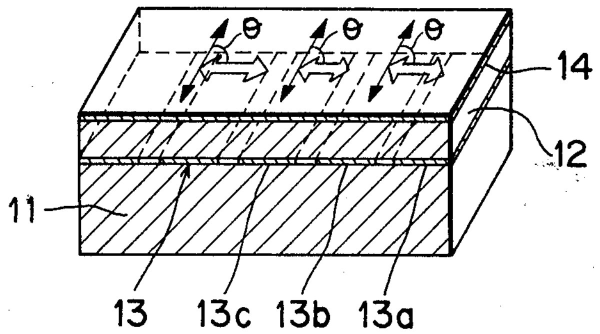
FIG. 3 is a perspective view illustrating the essential portion of an example of the ultrasonic probe in accordance with the present invention.

As shown in FIG. 3 illustrating one example of the probe in accordance with the present invention, a backing material 11, such as a rubber, a plastic, a metal or the like is provided thereon with a uniaxially elongated polymer piezoelectric body 12 by means of an adhesive or the like. At least one of the electrodes provided with the piezoelectric body is divided. For example, the electrode, generally referred to as 13, provided between the backing material 11 and the piezoelectric body 12 may be divided in the direction parallel to the elongational direction, as shown in black arrows, into sub-divisions 13*a*, 13*b*, 13*c*, . . ., 13*n*, whereby the array is formed; that is, the divisional direction, as shown in white arrow, is orthogonal to the elongational direction. A common electrode 14 is provided at the other side of the piezoelectric body 12 and may not be necessarily divided. The method of providing the divided electrodes may be any method, for example, a method involving the vapor deposition or sputtering by means of a mask plate having a predetermined pattern or a method forming a predetermined pattern by first providing an electrode over the whole surface and then treating the electrode by etching or cutting. The pattern so formed may be printed with a conductive paint.

Figure 4:
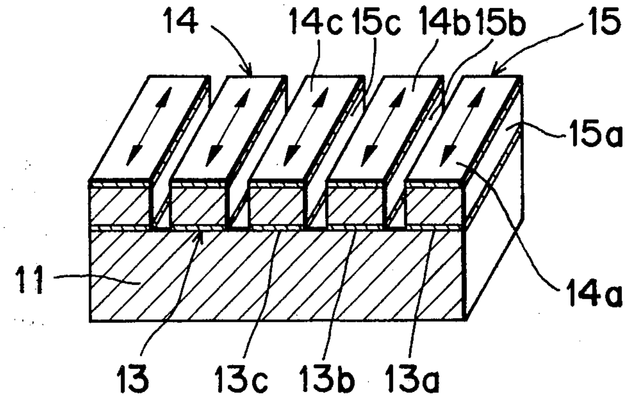
FIG. 4 is a perspective view illustrating the essential portion of another example of the ultrasonic probe in accordance with the present invention.

FIG. 4 illustrates another example of the probe in accordance with the present invention in which a unit element, generally referred to as 15, composed of the piezoelectric body resulting from a uniaxially elongated polymer film interposed between the respective electrodes, generally referred to as 13 and 14, is provided on the backing material 11. Each of the unit element comprises the piezoelectric elements 15*a*, 15*b*, 15*c*, . . ., 15*n*, which are interposed between the electrodes 13 and 14, respectively. The method of forming such divided elements may be any one, for example, a method involving by forming the piezoelectric body over the surface of the backing material and dividing the body into subdivisions by means of a cutter in a direction parallel to the elongational direction of the film. In FIG. 4, the piezoelectric elements 15*a*, 15*b*, 15*c*, . . ., 15*n* are disposed so as to be thoroughly separated from each other. The mode of arrangement of the piezoelectric elements may be such that merely the upper portions of the element portions are arranged so as to be separated from each other with the lower portions disposed integrally and successively or such that the cutting planes are provided with the inside of the backing material.

The ultrasonic probe in accordance with the present invention has a structure in which each of the unit elements is provided without undergoing any influence from the adjacent unit elements so that acoustic waves with no noises or, even if any, low noises are radiated, whereby an ultrasonic wave image is exhibited with a high resolving power.

Having described the specific embodiments of the present invention with reference to the accompanying drawings, it is to be understood that any variations or modifications be construed within the scope of this inventive concept as long as they do not depart from the spirit or nature of the present invention.

What is claimed is:

1. An ultrasonic probe containing a piezoelectric element comprising:

a backing material;

a uniaxially elongated polymer piezoelectric material;

the piezoelectric material interposed between a pair of electrodes;

at least one of the electrodes being divided into a plurality of long and small electrode portions and arranged in parallel with each other; and the electrodes being arranged at an angle $\theta$ in the scope ranging from 45° to 135° with respect to the direction in which the piezoelectric material is uniaxially elongated.

2. The ultrasonic probe according to claim 1, wherein the divided electrodes are disposed at substantially the right angle with respect to the direction in which the piezoelectric material is uniaxially elongated.

3. The ultrasonic probe according to claim 1, wherein at least one of the electrodes provided at the both sides of the piezoelectric material in the thin layer form is divided into a plurality of long and small electrode portions.

4. The ultrasonic probe according to claim 1, wherein the piezoelectric element is divided into a plurality of long and small unit elements, each of which is interposed between a pair of electrodes.

5. The ultrasonic probe according to claim 1, wherein the piezoelectric element is bonded to the backing material.

* * * * *